United States Patent
Zhu et al.

(10) Patent No.: US 6,377,440 B1
(45) Date of Patent: Apr. 23, 2002

(54) DIELECTRIC VARACTORS WITH OFFSET TWO-LAYER ELECTRODES

(75) Inventors: Yongfei Zhu, Columbia; Louise C. Sengupta, Warwick; Xubai Zhang, Columbia, all of MD (US)

(73) Assignee: Paratek Microwave, Inc., Columbia, MD (US)

( * ) Notice: Subject to any disclaimer, the term of this patent is extended or adjusted under 35 U.S.C. 154(b) by 0 days.

(21) Appl. No.: 09/660,309

(22) Filed: Sep. 12, 2000

(51) Int. Cl.[7] ................................................ H01G 4/06
(52) U.S. Cl. ..................... 361/311; 361/321.2; 361/312; 361/321.5; 29/25.03; 257/595; 257/602; 257/661
(58) Field of Search ............................. 361/311, 321.5, 361/312, 321.2, 321.3, 278, 290, 292; 29/25.03; 257/595

(56) References Cited

U.S. PATENT DOCUMENTS

| | | | |
|---|---|---|---|
| 3,879,645 A | * 4/1975 | Rutt et al. .................. 317/258 |
| 5,312,790 A | 5/1994 | Sengupta et al. |
| 5,427,988 A | 6/1995 | Sengupta et al. |
| 5,486,491 A | 1/1996 | Sengupta et al. |
| 5,635,433 A | 6/1997 | Sengupta |
| 5,635,434 A | 6/1997 | Sengupta |
| 5,640,042 A | * 6/1997 | Koscica et al. ............. 257/595 |
| 5,693,429 A | 12/1997 | Sengupta et al. |
| 5,721,194 A | 2/1998 | Yandrofski et al. |
| 5,766,697 A | 6/1998 | Sengupta et al. |
| 5,830,591 A | 11/1998 | Sengupta et al. |
| 5,846,893 A | 12/1998 | Sengupta et al. |
| 6,058,005 A | 5/2000 | Matoba et al. |
| 6,078,494 A | 6/2000 | Hansen |
| 6,088,214 A | 7/2000 | Malone et al. |
| 6,088,216 A | 7/2000 | Laibowitz et al. |
| 6,096,127 A | * 8/2000 | Dimos et al. .................. 117/9 |
| 6,097,263 A | * 8/2000 | Mueller et al. ............. 333/17.1 |

* cited by examiner

*Primary Examiner*—Dean A. Reichard
*Assistant Examiner*—Nguyen Ha
(74) *Attorney, Agent, or Firm*—Robert P. Lenart, Pietragallo, Bosick & Gordon

(57) ABSTRACT

A varactor comprising a substrate, a first conductor positioned on a surface of the substrate, a second conductor positioned on the surface of the substrate forming a gap between the first and second conductors, a tunable dielectric material positioned on the surface of the substrate and within the gap, the tunable dielectric material having a top surface, with at least a portion of said top surface being positioned above the gap opposite the surface of the substrate, and a first portion of the second conductor extending along at least a portion of the top surface of the tunable dielectric material. The second conductor can overlap or not overlap a portion of the first conductor.

16 Claims, 4 Drawing Sheets

DIELECTRIC VARACTORS WITH OFFSET TWO-LAYER ELECTRODES

BACKGROUND OF INVENTION

This invention relates generally to tunable capacitors, and more particularly to voltage-tuned dielectric capacitors that operate at radio frequencies.

A varactor is a voltage tunable capacitor in which the capacitance can be changed by the voltage applied thereto. This property has many applications in radio frequency (RF) circuits, such as tunable filters, phase shifters, delay lines, voltage controlled oscillators, and so on. The most commonly used varactor is a semiconductor diode varactor. However, semiconductor diode varactors suffer from low Q factors (especially at high frequencies), low power handling, and high intermodulation distortion. Common varactors used today are silicon and gallium arsenide based diodes. The performance of these varactors is defied by the capacitance ratio, $C_{max}/C_{min}$, frequency range and figure of merit, or Q factor, at the specified frequency range. The Q factors for these semiconductor varactors for frequencies up to 2 GHz are usually very good. However, at frequencies above 2 GHz, the Q factors of these varactors degrade rapidly. For example, at 10 GHz the Q factors for these varactors are usually only about 30.

Another type of tunable varactor is a dielectric varactor, whose capacitance is tuned by applying a control voltage to change a dielectric constant in a tunable dielectric material. Dielectric varactors have high Q factors, high power handling, low intermodulation distortion, wide capacitance range, and low cost.

Tunable ferroelectric materials are materials whose permittivity (more commonly called dielectric constant) can be varied by varying the strength of an electric field to which the materials are subjected. Even though these materials work in their paraelectric phase above the Curie temperature, they are conveniently called "ferroelectric" because they exhibit spontaneous polarization at temperatures below the Curie temperature. Tunable ferroelectric materials including barium-strontium titanate (BST) or BST composites have been the subject of several patents.

Dielectric materials including barium strontium titanate are disclosed in U.S. Pat. No. 5,312,790 to Sengupta, et al. entitled "Ceramic Ferroelectric Material"; U.S. Pat. No. 5,427,988 to Sengupta, et al. entitled "Ceramic Ferroelectric Composite Material—BSTO—MgO"; U.S. Pat. No. 5,486,491 to Sengupta, et al. entitled "Ceramic Ferroelectric Composite Material—BSTO—ZrO$_2$"; U.S. Pat. No. 5,635,434 to Sengupta, et al. entitled "Ceramic Ferroelectric Composite Material—BSTO-Magnesium Based Compound"; U.S. Pat. No. 5,830,591 to Sengupta, et al. entitled "Multilayered Ferroelectric Composite Waveguides"; U.S. Pat. No. 5,846,893 to Sengupta, et al. entitled "Thin Film Ferroelectric Composites and Method of Making"; U.S. Pat. No. 5,766,697 to Sengupta, et al. entitled "Method of Making Thin Film Composites"; U.S. Pat. No. 5,693,429 to Sengupta, et al. entitled "Electronically Graded Multilayer Ferroelectric Composites"; and U.S. Pat. No. 5,635,433 to Sengupta, entitled "Ceramic Ferroelectric Composite Material—BSTO—ZnO". These patents are hereby incorporated by reference. A copending, commonly assigned United States patent application titled "Electronically Tunable Ceramic Materials Including Tunable Dielectric And Metal Silicate Phases", by Sengupta, filed Jun. 15, 2000, discloses additional tunable dielectric materials and is also incorporated by reference. The materials shown in these patents, especially BSTO—MgO composites, show low dielectric loss and high tunability. Tunability is defined as the fractional change in the dielectric constant with applied voltage.

There are two conventional dielectric varactor structures, a planar structure and a vertical structure. The conventional planar structure varactor has a simple configuration, simple fabrication processing, and low capacitance. In planar structure varactors, a tunable film is directly deposited on a whole surface of a substrate, followed by the deposition of metal film. A metal etching process is used to obtain specific metal patterns. High processing temperatures may be necessary to achieve a high-quality tunable film. The quality of the tunable film is the main factor in determining performance of the dielectric varactor. The processing temperature of the tunable film is typically above 650° C. for thin film, and above 1000° C. for thick film. Since there is no bottom electrode or metal film that is subject to the high processing temperature, the conventional planar structure varactor may be more easily fabricated than the vertical structure varactor.

Varactors that utilize a thin film ferroelectric ceramic as a voltage tunable element in combination with a superconducting element have been described. For example, U.S. Pat. No. 5,640,042 discloses a thin film ferroelectric varactor having a carrier substrate layer, a high temperature superconducting layer deposited on the substrate, a thin film ferroelectric deposited on the metallic layer, and a plurality of metallic conductive means disposed on the thin film ferroelectric, which are placed in electrical contact with RF transmission lines in tuning devices. Another tunable capacitor using a ferroelectric material in combination with a superconducting material is disclosed in U.S. Pat. No. 5,721,194.

In some radio frequency applications, varactors having a relatively low capacitance are required. By adjusting gap size and gap width in a planar varactor, low capacitance (~1 pF) is very easily obtained. However, the bias voltage required for planar structure varactors with such relatively low capacitance can become excessive.

Using the vertical structure, wherein a layer of tunable dielectric material is positioned between two flat electrodes, can significantly reduce the required bias voltage. The bias voltage in a planar varactor is much higher than that for the vertical structure varactor, because the gap in the planar structure is usually much bigger than thickness of the tunable film in the vertical structure, especially in the case of thin film varactors.

However in a vertical structure varactor, it is difficult to achieve low capacitance, such as less than 1 pF, because of the small thickness and high dielectric constant of the tunable film. Reducing electrode area is a way to make low capacitance varactors, which are desired for many tunable devices. However, the area of the top electrode, which determines capacitance, is limited by etching processing, and the connection line (wire).

There is a need for relatively low capacitance varactors that can operate at temperatures above those necessary for superconduction and at bias voltages less than those required for existing planar varactor structures, while maintaining high tunability and high Q factors.

SUMMARY OF THE INVENTION

Varactors constructed in accordance with this invention include a substrate, a first conductor positioned on a surface of the substrate, a second conductor positioned on the surface of the substrate forming a gap between the first and second conductors, a tunable dielectric material positioned on the surface of the substrate and within the gap, the tunable dielectric material having a top surface, with at least a portion of said top surface being positioned above the gap opposite the surface of the substrate, and a first portion of the second conductor extending along at least a portion of the top surface of the tunable dielectric material. The second conductor can overlap or not overlap a portion of the first conductor.

DETAILED DESCRIPTION OF THE INVENTION

Figure 1:
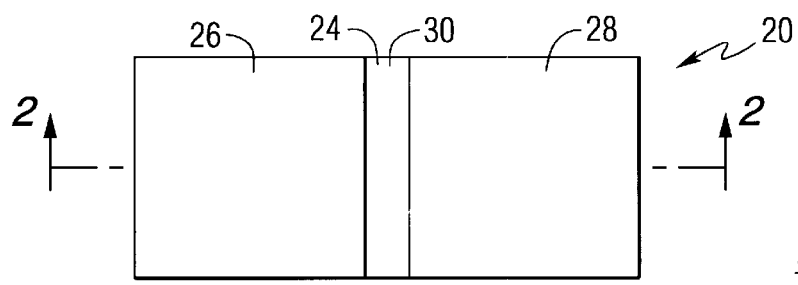
FIG. 1 is a plan view of a prior art planar varactor.
Figure 2:
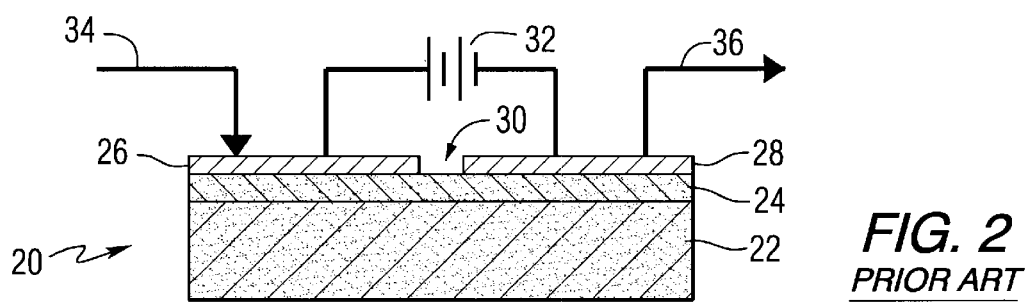
FIG. 2 is a sectional view of the planar varactor of FIG. 1 taken along line 2—2.

Referring to the drawings, FIGS. 1 and 2 are top and cross-sectional views of a prior art planar varactor 20. The varactor includes a substrate 22 and a layer of tunable dielectric material 24 positioned on a surface of the substrate. A pair of electrodes 26 and 28 are positioned on a surface of the tunable dielectric layer opposite the substrate and separated by a gap 30. A DC bias voltage, as illustrated by voltage source 32, is applied to the electrodes to control the dielectric constant of the tunable dielectric material. An input 34 is provided for receiving an electrical signal and an output 36 is provided for delivering the signal.

Figure 3:
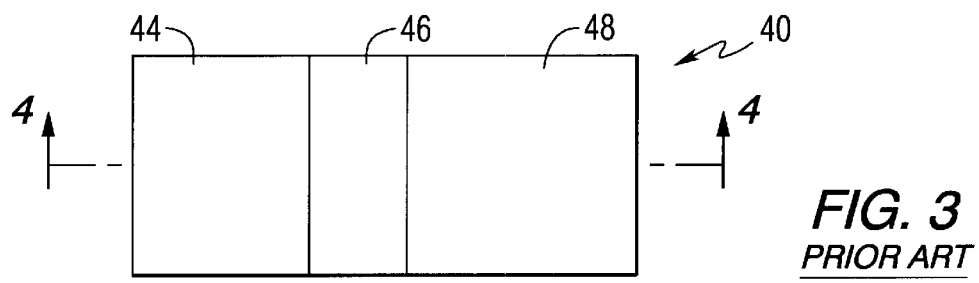
FIG. 3 is a plan view of a prior art vertical varactor.
Figure 4:
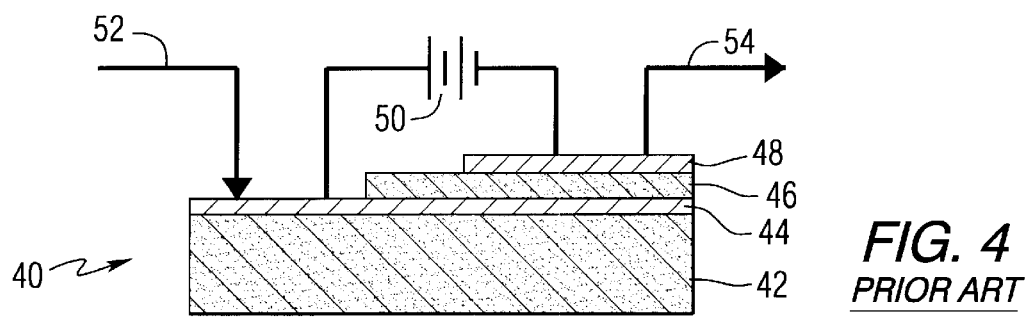
FIG. 4 is a sectional view of the vertical varactor of FIG. 3 taken along line 4—4.

FIGS. 3 and 4 are top and cross-sectional views of a prior art vertical varactor 40. The varactor includes a substrate 42 and a first electrode 44 positioned on a surface of the substrate. A layer of tunable dielectric material 46 is positioned on a surface of the first electrode opposite the substrate. A second electrode 48 is positioned on a surface of the tunable dielectric layer opposite the first electrode. A DC bias voltage, as illustrated by voltage source 50, is applied to the electrodes 44 and 48 to control the dielectric constant of the tunable dielectric material lying between the electrodes 44 and 48. An input 52 is provided for receiving an electrical signal and an output 54 is provided for delivering the signal.

Figure 5:
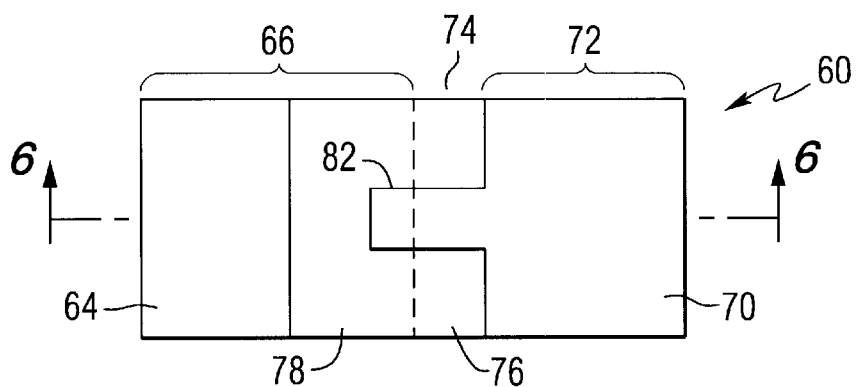
FIG. 5 is a plan view of a varactor constructed in accordance with the present invention.
Figure 6:
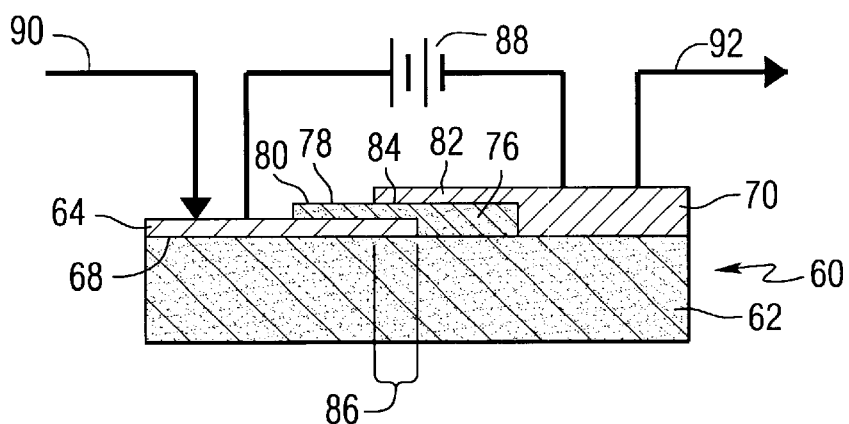
FIG. 6 is a sectional view of the varactor of FIG. 5 taken along line 6—6.

FIGS. 5 and 6 are top plan and cross-sectional views of a varactor 60 constructed in accordance with the present invention. The varactor includes a substrate 62 and a first electrode 64 positioned on first portion 66 of a surface 68 of the substrate. A second electrode 70 is positioned on second portion 72 of the surface 68 of the substrate and separated from the first electrode to form a gap 74 therebetween. A tunable dielectric material 76 is positioned on the surface 68 of the substrate and in the gap between the first and second electrodes. A section 78 of the tunable dielectric material 76 extends along a surface 80 of the first electrode 64 opposite the substrate. The second electrode 70 includes a projection 82 that is positioned on a top surface 84 of the tunable dielectric layer opposite the substrate. In this embodiment of the invention projection 82 has a rectangular shape and extends along the top surface 84 such that it vertically overlaps a portion 86 of the first electrode. The second electrode can be referred to as a "T-type" electrode. A DC bias voltage, as illustrated by voltage source 88, is applied to the electrodes 64 and 70 to control the dielectric constant of the tunable dielectric material lying between the electrodes 64 and 70. An input 90 is provided for receiving an electrical signal and an output 92 is provided for delivering the signal.

The tunable dielectric layer 76 can be a thin or thick film. The capacitance of the varactor of FIGS. 5 and 6 can be expressed as:

$$C = \epsilon_o \epsilon_r A / t$$

where C is capacitance of the capacitor; $\epsilon_o$ is permittivity of free-space; $\epsilon_r$ is dielectric constant (permittivity) of the tunable film; A is overlap area of the electrode 64 that is overlapped by electrode 70; and t is thickness of the tunable film in the overlapped section. An example of these parameters for 1 pF capacitor is: $\epsilon_r$=200; A=170 $\mu m^2$; and t=0.3 $\mu$m. The horizontal distance (HD) along the surface of the substrate between the first and second electrodes is much greater than the thickness (t) of the dielectric film. Typically, thickness of tunable film is <1 micrometer for thin films, and <5 micrometers for thick film, and the HD is greater than 50 micrometers. Theoretically, if HD is close to t, the capacitor will still work, but its capacitance would be slightly greater than that calculated from the above equation. However, from a processing technical view, it is difficult and not necessary to make HD close to t. Therefore, HD mainly depends on the processing use to fabricate the device, and is typically about >50 micrometers. In practice, we choose HD>10t.

The substrate layer 62 may be comprised of MgO, alumina ($AL_2O_3$), $LaAlO_3$, sapphire, quartz, silicon, gallium arsenide, and other materials that are compatible with the various tunable films and the electrodes, as well as the processing used to produce the tunable films and the electrodes.

The bottom electrode 64 can be deposited on the surface of the substrate by electron-beam, sputtering, electroplating or other metal film deposition techniques. The bottom electrode partially covers the substrate surface, which is typically done by etching processing. The thickness of the bottom electrode in one preferred embodiment is about 2 $\mu$m. The bottom electrode should be compatible with the substrate and the tunable films, and should be able to withstand the film processing temperature. The bottom electrode may typically be comprised of platinum, platinum-rhodium, ruthenium oxide or other materials that are compatible with the substrate and tunable films, as well as with the film processing. Another film may be required between the substrate and bottom electrode as an adhesion layer, or buffer layer for some cases, for example platinum on silicon can use a layer of silicon oxide, titanium or titanium oxide as a buffer layer.

The thin or thick film of tunable dielectric material 76 is then deposited on the bottom electrode and the rest of the substrate surface by techniques such as metal-organic solution deposition (MOSD or simply MOD), metal-organic vapor deposition (MOCVD), pulse laser deposition (PLD), sputtering, screen printing and so on. The thickness of the thin or thick film that lies above the bottom electrode is preferably in the range of 2.0 $\mu$m to 4 $\mu$m. It is well known that the performance of a varactor depends on the quality of the tunable dielectric film. Therefore low loss and high tunability films should be selected to achieve high Q and high tuning of the varactor. These tunable dielectric films have dielectric constants of 2 to 1000, and tuning of greater than 20% with a loss tangent less than 0.005 at around 2 GHz. To achieve low capacitance, low dielectric constant (k) films should be selected. However, high k films usually show high tunability. The typical k range is about 100 to 500.

In the preferred embodiment the tunable dielectric layer is preferably comprised of Barium-Strontium Titanate, $Ba_xSr_{1-x}TiO_3$ (BSTO), where x can range from zero to one, or BSTO-composite ceramics. Examples of such BSTO composites include, but are not limited to: BSTO—MgO, BSTO—$MgAl_2O_4$, BSTO—$CaTiO_3$, BSTO—$MgTiO_3$, BSTO—$MgSrZrTiO_6$, and combinations thereof. Other tunable dielectric materials may be used partially or entirely in place of barium strontium titanate. An example is $Ba_xCa_{1-x}TiO_3$, where x ranges from 0.2 to 0.8, and preferably from 0.4 to 0.6. Additional alternative tunable ferroelectrics include $Pb_xZr_{1-x}TiO_3$ (PZT) where x ranges from 0.05 to 0.4, lead lanthanum zirconium titanate (PLZT), lead titanate ($PbTiO_3$), barium calcium zirconium titanate ($BaCaZrTiO_3$), sodium nitrate ($NaNO_3$), $KNbO_3$; $LiNbO_3$, $LiTaO_3$, $PbNb_2O_6$, $PbTa_2O_6$, $KSr(NbO_3)$, and $NaBa_2(NbO_3)_5$ and $KH_2PO_4$.

The second electrode 70 is formed by a conducting material deposited on the surface of the substrate and at least partially overlapping the tunable film, by using similar processing as set forth above for the bottom electrode. Metal etching processing can be used to achieve specific top electrode patterns. The etching processing may be dry or wet etching. The top electrode materials can be gold, silver, copper, platinum, ruthenium oxide or other conducting materials that are compatible with the tunable films. Similar to the bottom electrode, a buffer layer for the top electrode could be necessary, depending on electrode-tunable film system. Finally, a part of the tunable film should be etched away to expose the bottom electrode.

Figure 7:
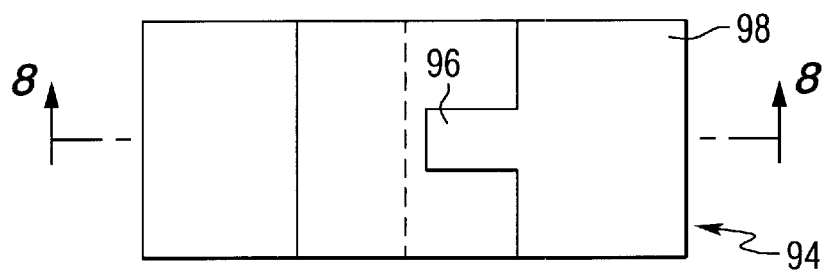
FIG. 7 is a plan view of another varactor constructed in accordance with the present invention.
Figure 8:
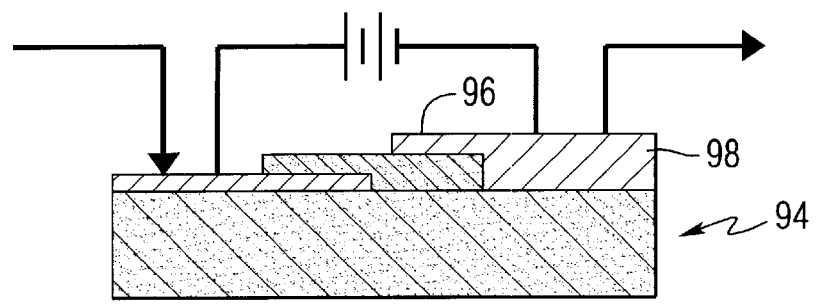
FIG. 8 is a sectional view of the varactor of FIG. 7 taken along line 8—8.

For a certain thickness and dielectric constant of the tunable dielectric film, the pattern and arrangement of the top electrode are key parameters in determining the capacitance of the varactor. In order to achieve low capacitance, the top electrode may have a small overlap (as shown in FIGS. 5 and 6) or no overlap with the bottom electrode. FIGS. 7 and 8 are top plan and cross-sectional views of a varactor 94 having a T-type top electrode with no overlap electrode area. The structural elements of the varactor of FIGS. 7 and 8 are similar to the varactor of FIGS. 5 and 6, except that the rectangular projection 96 on electrode 98 is smaller and does not overlap electrode 64. Varactors with no overlap electrode area may need more tuning voltage than those in which the electrodes overlap.

Figure 9:
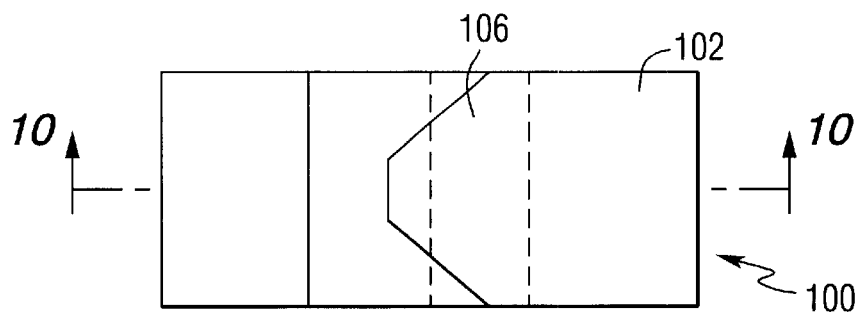
FIG. 9 is a plan view of another varactor constructed in accordance with the present invention.
Figure 10:
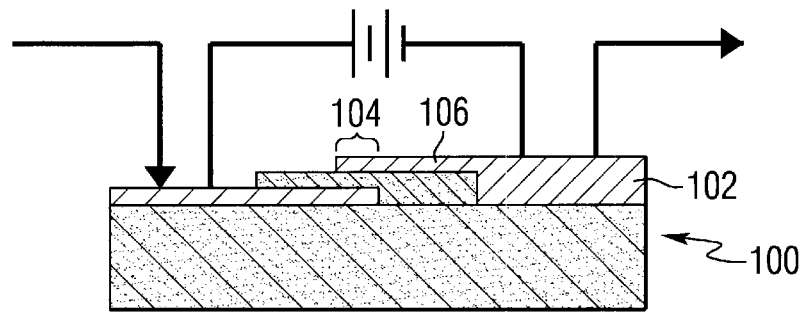
FIG. 10 is a sectional view of the varactor of FIG. 9 taken along line 10—10.
Figure 11:
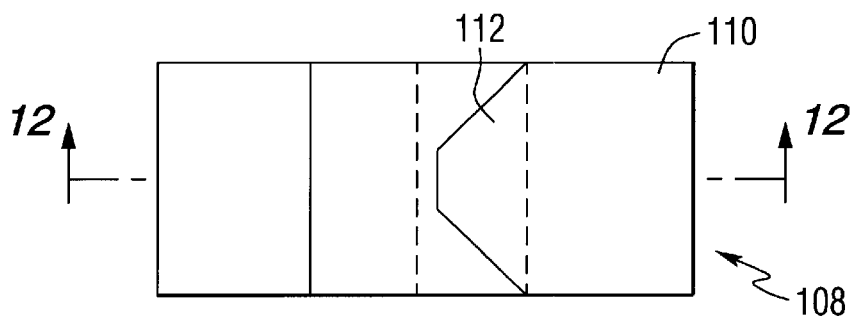
FIG. 11 is a plan view of another varactor constructed in accordance with the present invention.
Figure 12:
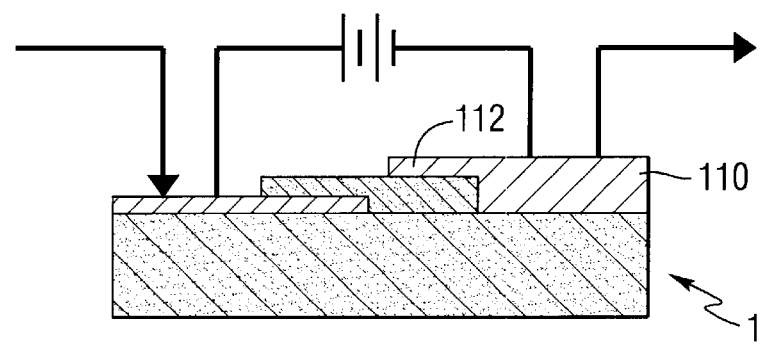
FIG. 12 is a sectional view of the varactor of FIG. 11 taken along line 12—12.

FIGS. 9 and 10 are top plan and cross-sectional views of a varactor 100 having a top electrode 102 with a trapezoid-type projection 106 and an overlapped electrode area 104. The structural elements of the varactor of FIGS. 9 and 10 are similar to the varactor of FIGS. 5 and 6, except that the projection 106 on electrode 102 has a trapezoidal shape. Since the projection on the T-type electrode of the varactor of FIGS. 5 and 6 is relatively narrow, the trapezoid-type top electrode of the varactor of FIGS. 9 and 10 is less likely to break, compared to the T-type pattern varactor. FIGS. 11 and 12 are top plan and cross-sectional views of a varactor 108 having a trapezoid-type electrode 110 having a smaller projection 112 with no overlap area of electrodes to obtain lower capacitance.

Figure 13:
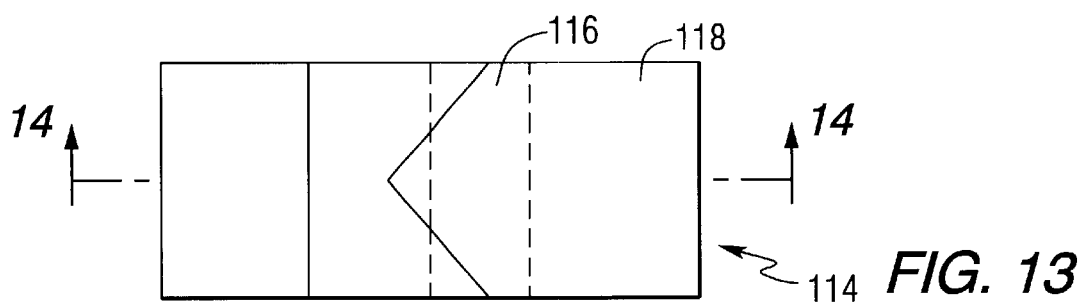
FIG. 13 is a plan view of another varactor constructed in accordance with the present invention.
Figure 14:
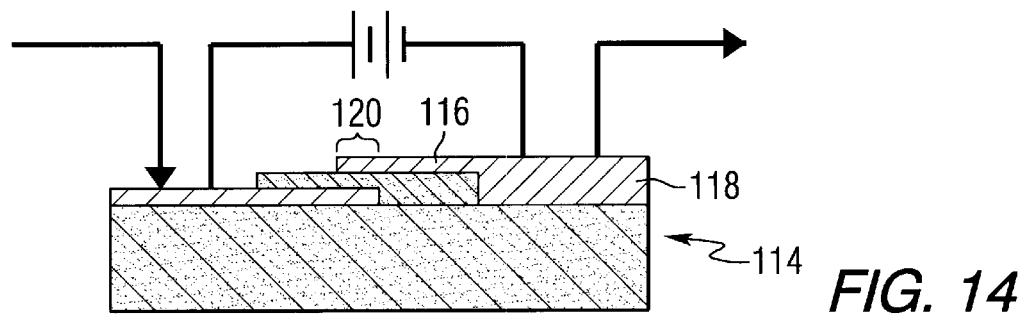
FIG. 14 is a sectional view of the varactor of FIG. 13 taken along line 14—14.
Figure 15:
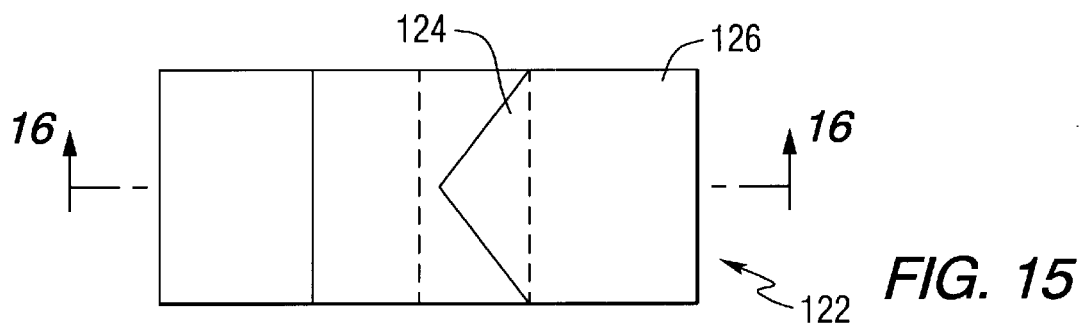
FIG. 15 is a plan view of another varactor constructed in accordance with the present invention.
Figure 16:
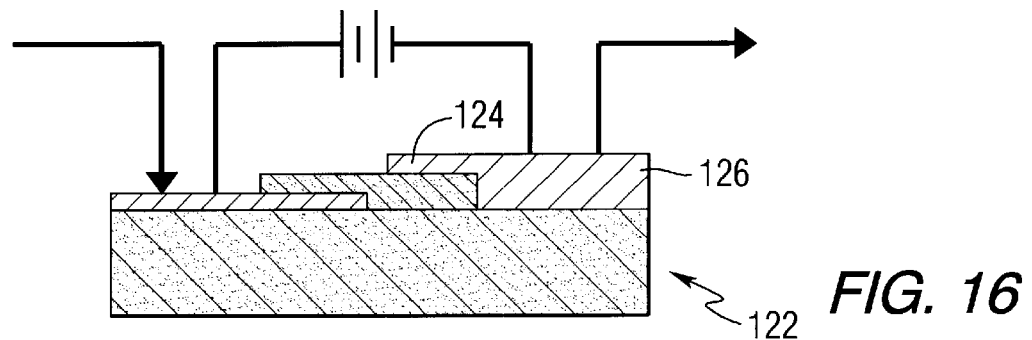
FIG. 16 is a sectional view of the varactor of FIG. 15 taken along line 16—16.

FIGS. 13 and 14 are top plan and cross-sectional views of a varactor 114 having triangle-type projection 116 on the top electrode 118 that overlaps a portion of the bottom electrode at region 120. Using a triangle projection on the top electrode may make it easier to reduce the overlap area of electrodes. FIGS. 15 and 16 are top plan and cross-sectional views of a varactor 122 having triangle-type projection 124 on the top electrode 126 that does not overlap the bottom electrode.

This invention provides dielectric varactors having low capacitance, high Q, low tuning voltage, high power handling, and low cost. These advantages make the varactors suitable for tunable devices in applications such as tunable filters (for example, for use in handset applications), phase shifters, voltage controlled oscillators and so on in the VHF, UHF, microwave, and millimeter wave frequency range.

The invention provides voltage tunable thick film and thin film varactors that can be used in room temperature voltage tunable devices such as filters, phase shifters, voltage controlled oscillators, delay lines, and tunable resonators, or any combination thereof. Vertical structure dielectric varactors with specific electrode patterns and arrangements as described above are used to achieve low capacitance in the present invention. Variable overlap and no overlap structures of the bottom and top electrodes are designed to limit effective area of the vertical capacitor. Low loss and high tunability thin and thick films are used to improve performance of the varactors. Combined with the low loss and high tunability materials, the new varactors have low capacitance, higher Q, high tuning, and low bias voltage.

Accordingly, the present invention, by utilizing these above basic varactor structures and high quality tunable dielectric materials, provides a high performance dielectric varactor for applications in RF tunable circuits. This invention has many practical applications and many other modifications of devices may be obvious to those skilled in the art without departing from the spirit and scope of this invention as defined by the claims.

What is claimed is:

1. A varactor comprising:

a substrate;

a first conductor positioned on a surface of the substrate;

a second conductor positioned on the surface of the substrate forming a gap between the first and second conductors;

a tunable dielectric material positioned on the surface of the substrate and within the gap, said tunable dielectric material having a top surface, at least a portion of said top surface being positioned above the gap opposite the surface of the substrate; and a first portion of the second conductor extending along at least a portion of the top surface of the tunable dielectric material.

2. The varactor of claim 1, wherein:

a portion of the tunable dielectric material lies along a surface of the first conductor opposite the surface of the substrate.

3. The varactor of claim 2, wherein the first portion of the second conductor has a shape that is one of: rectangular, triangular, and trapezoidal.

4. The varactor of claim 3, wherein the tunable dielectric layer comprises one of:

barium strontium titanate, barium calcium titanate, lead zirconium titanate, lead lanthanum zirconium titanate, lead titanate, barium calcium zirconium titanate, sodium nitrate, $KNbO_3$, $LiNbO_3$, $LiTaO_3$, $PbNb_2O_6$, $PbTa_2O_6$, $KSr(NbO_3)$, $NaBa_2(NbO_3)_5$, $KH_2PO_4$, and composites thereof.

5. The varactor of claim 4, wherein the substrate comprises one of:

MgO, alumina ($AL_2O_3$), $LaAlO_3$, sapphire, quartz, silicon, and gallium arsenide.

6. The varactor of claim 5, wherein:

the first portion of the second conductor overlaps a portion of the first conductor.

7. The varactor of claim 3, wherein the tunable dielectric layer comprises a barium strontium titanate (BSTO) composite selected from the group of:

BSTO—MgO, BSTO—$MgAl_2O_4$, BSTO—$CaTiO_3$, BSTO—$MgTiO_3$, BSTO—$MgSrZrTiO_6$, and combinations thereof.

8. The varactor of claim 7, wherein the substrate comprises one of:

MgO, alumina ($AL_2O_3$), $LaAlO_3$, sapphire, quartz, silicon, and gallium arsenide.

9. The varactor of claim 8, wherein:

the first portion of the second conductor overlaps a portion of the first conductor.

10. The varactor of claim 1, wherein:

the first portion of the second conductor overlaps a portion of the first conductor.

11. The varactor of claim 1, wherein the tunable dielectric layer comprises one of:

barium strontium titanate, barium calcium titanate, lead zirconium titanate, lead lanthanum zirconium titanate, lead titanate, barium calcium zirconium titanate, sodium nitrate, $KNbO_3$, $LiNbO_3$, $LiTaO_3$, $PbNb_2O_6$, $PbTa_2O_6$, $KSr(NbO_3)$, $NaBa_2(NbO_3)_5$, $KH_2PO_4$, and composites thereof.

12. The varactor of claim 1, wherein the tunable dielectric layer comprises a barium strontium titanate (BSTO) composite selected from the group of:

BSTO—MgO, BSTO—$MgAl_2O_4$, BSTO—$CaTiO_3$, BSTO—$MgTiO_3$, BSTO—$MgSrZrTiO_6$, and combinations thereof.

13. The varactor of claim 1, wherein the substrate comprises one of:

MgO, alumina ($AL_2O_3$), $LaAlO_3$, sapphire, quartz, silicon, and gallium arsenide.

14. The varactor of claim 1, wherein the first conductor comprises one of:

platinum, platinum-rhodium, and ruthenium oxide.

15. The varactor of claim 14, wherein the second conductor comprises one of:

gold, silver, copper, platinum, and ruthenium oxide.

16. The varactor of claim 1, wherein the second conductor comprises one of:

gold, silver, copper, platinum, and ruthenium oxide.

* * * * *

UNITED STATES PATENT AND TRADEMARK OFFICE
CERTIFICATE OF CORRECTION

PATENT NO.      : 6,377,440 B1  
DATED           : April 23, 2002  
INVENTOR(S)     : Zhu et al.

It is certified that error appears in the above-identified patent and that said Letters Patent is hereby corrected as shown below:

Column 1,
Line 19, replace "defied" with -- defined --.

Column 5,
Line 18, replace "2.0" with -- 0.2 --.

Signed and Sealed this

Fourth Day of January, 2003

JAMES E. ROGAN
*Director of the United States Patent and Trademark Office*